United States Patent
Hosseini et al.

(10) Patent No.: US 7,880,285 B2
(45) Date of Patent: Feb. 1, 2011

(54) SEMICONDUCTOR DEVICE COMPRISING A SEMICONDUCTOR CHIP STACK AND METHOD FOR PRODUCING THE SAME

(75) Inventors: Khalil Hosseini, Weihmichl (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 175 days.

(21) Appl. No.: 11/866,034

(22) Filed: Oct. 2, 2007

(65) Prior Publication Data

US 2008/0258277 A1 Oct. 23, 2008

(30) Foreign Application Priority Data

Apr. 19, 2007 (DE) .................. 10 2007 018 914

(51) Int. Cl.
*H01L 23/02* (2006.01)
(52) U.S. Cl. .................. 257/686; 257/E23.169
(58) Field of Classification Search ........... 257/686, 257/E23.169
See application file for complete search history.

(56) References Cited

U.S. PATENT DOCUMENTS

| | | | |
|---|---|---|---|
| 4,859,631 A | | 8/1989 | Barre |
| 5,562,837 A | | 10/1996 | De Givry |
| 5,898,223 A | * | 4/1999 | Frye et al. .................. 257/777 |
| 6,414,384 B1 | * | 7/2002 | Lo et al. .................. 257/685 |
| 6,437,449 B1 | * | 8/2002 | Foster .................. 257/777 |
| 6,603,072 B1 | | 8/2003 | Foster et al. |
| 6,894,381 B2 | | 5/2005 | Hetzel et al. |
| 7,166,495 B2 | | 1/2007 | Ball |
| 7,271,470 B1 | | 9/2007 | Otremba |
| 2002/0027295 A1 | * | 3/2002 | Kikuma et al. .................. 257/780 |
| 2004/0056277 A1 | * | 3/2004 | Karnezos .................. 257/200 |
| 2004/0253762 A1 | * | 12/2004 | Lee .................. 438/109 |
| 2005/0090050 A1 | * | 4/2005 | Shim et al. .................. 438/200 |
| 2005/0124093 A1 | | 6/2005 | Yang et al. |
| 2005/0263873 A1 | * | 12/2005 | Shoji .................. 257/698 |
| 2006/0118938 A1 | | 6/2006 | Tandy |
| 2006/0261453 A1 | * | 11/2006 | Lee et al. .................. 257/676 |
| 2007/0176277 A1 | | 8/2007 | Brunnbauer et al. |

OTHER PUBLICATIONS

"StakPak IGBT Press-packs: A new Packaging Concept for High Power Electronics," ABB Semiconductors Inc., Apr. 2004.

* cited by examiner

*Primary Examiner*—Minh-Loan T Tran
*Assistant Examiner*—Leslie Pilar Cruz
(74) *Attorney, Agent, or Firm*—Edell, Shapiro & Finnan, LLC

(57) ABSTRACT

A semiconductor device includes a semiconductor chip stack having at least one lower semiconductor chip as a base of the semiconductor chip stack, and at least one upper semiconductor chip. An insulating intermediate plate is arranged between the semiconductor chips. Connecting elements wire the semiconductor chips, the intermediate plate and external terminals to one another.

20 Claims, 7 Drawing Sheets

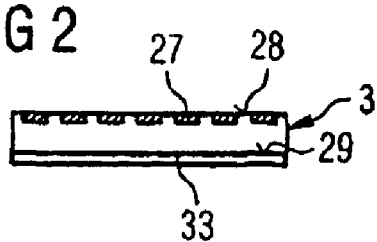
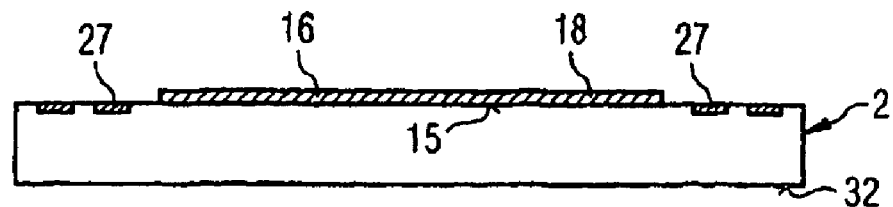
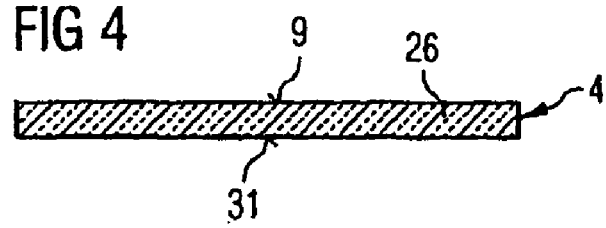
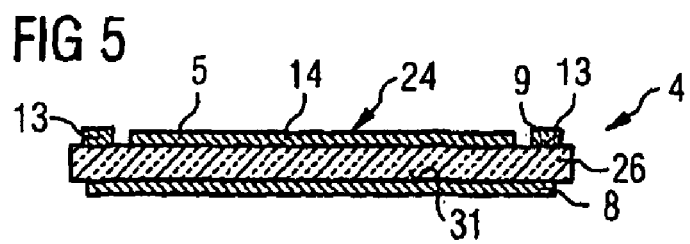
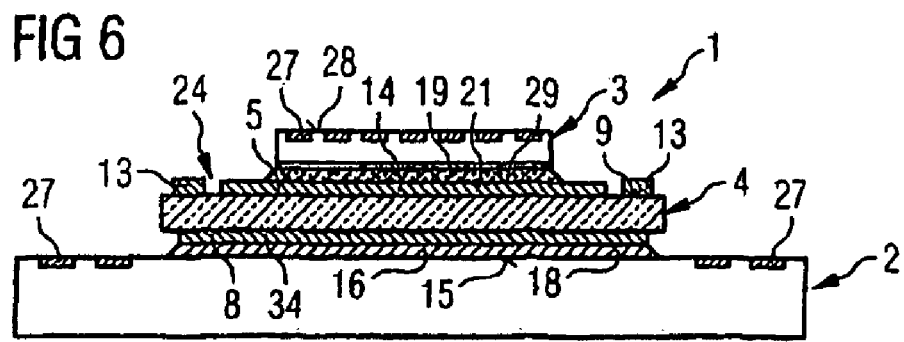

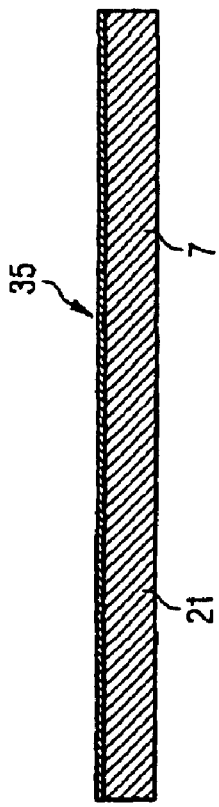

SEMICONDUCTOR DEVICE COMPRISING A SEMICONDUCTOR CHIP STACK AND METHOD FOR PRODUCING THE SAME

CROSS REFERENCE TO RELATED APPLICATIONS

This application claims priority under 35 U.S.C. §119 to Application No. DE 102007018914.3 filed on Apr. 19, 2007, entitled "Semiconductor Device Comprising a Semiconductor Chip Stack and Method for Producing the Same," the entire contents of which are hereby incorporated by reference.

BACKGROUND

The invention relates to a semiconductor device comprising a semiconductor chip stack and a method for producing the same. Semiconductor devices of this type have at least one lower semiconductor chip as base of the semiconductor chip stack and at least one upper semiconductor chip. In this case, the semiconductor chips are stacked directly one on top of another. In the case of conventional stacking of this type it must be ensured that the individual potentials of the semiconductor chips are effectively insulated from one another during the stacking.

Electrical insulation, however, is detrimental to the thermal conductivity. Thus, by way of example, when a logic chip is fixed onto a transistor by means of an insulating adhesive, thermal conductivity is adversely affected. This is because an increased thermal resistance forms on the top side of the lower semiconductor chip, which forms the base, as a result of an upper stacked semiconductor chip being applied by adhesive bonding. In addition, the size of the upper semiconductor chip is disadvantageously limited with regard to its areal extent since it cannot project beyond the edge of the lower semiconductor chip without increasing the risk of the semiconductor chip stack breaking.

Furthermore as a result of semiconductor chips being adhesively bonded onto one another to form a semiconductor chip stack, a redistribution wiring between the electrodes of the semiconductor chips that are adhesively bonded onto one another, namely those on the top side of the lower semiconductor chip and those on the rear side of the upper semiconductor chip, is not possible without considerable outlay in terms of costs. Power semiconductor chips having electrodes on the top side and the rear side cannot therefore be stacked satisfactorily by means of adhesive bonding technology. In the case of semiconductor chips of this type it is only possible for electrodes that are of identical type and equal in area, that is to say congruent, to be adhesively bonded onto one another by means of a conductor adhesive, such that in circuitry terms only restricted functions can be realized by means of a stacking.

Moreover, it is possible, in the context of "wafer level packaging technology" to electrically connect two composite plates with corresponding embedded semiconductor chips and with wiring structures on coplanar top sides via through contacts in such a way that a semiconductor device comprising a semiconductor chip stack arises, the semiconductor chips of which are electrically wired to one another via vertical through contacts and horizontal wiring structures. Such stacking of semiconductor chips is not advantageous for stacking power semiconductor chips on account of the thermal insulation of the semiconductor chip stack, even though the wiring possibilities are improved.

Furthermore, it is possible to create multilayered ceramic substrates which can be equipped with semiconductor chips on both sides, such that the heat-loss-generating top sides of the semiconductor chips are uncovered on both sides of the substrate plate and can dissipate heat. However, this requires a substrate technology having a high material outlay.

Finally, it is also possible to provide semiconductor chips with a sequence of metallization and insulation layers on the areas with which they are intended to be connected, and then to adhesively bond them onto one another. Although this affords the possibility of complex wiring, the thermal effects are serious and not advantageous for power semiconductor devices.

In light of the foregoing, there is a need for improved semiconductor chip stack configurations.

SUMMARY

The invention relates to a semiconductor device comprising a semiconductor chip stack and a method for producing the same. The semiconductor device has a semiconductor chip stack having at least one lower semiconductor chip as a base of the semiconductor chip stack, and at least one upper semiconductor chip. An insulating intermediate plate is arranged between the semiconductor chips. Furthermore, the connecting elements electrically connect the semiconductor chips, the intermediate plate and external terminals of the semiconductor device to one another. In this case, the semiconductor device has surface-mountable external contacts on its underside.

BRIEF DESCRIPTION OF THE DRAWINGS

The invention will now be explained in more detail with reference to figures.

FIGS. 2 to 9 show schematic views of components of the semiconductor device in accordance with FIG. 1 during the production thereof, and specifically:

FIG. 2 shows a schematic cross section through an upper semiconductor chip for a semiconductor chip stack;

FIG. 3 shows a schematic cross section through a lower semiconductor chip for a semiconductor chip stack;

FIG. 4 shows a schematic cross section through a blank of an intermediate plate;

FIG. 5 shows a schematic cross section through an intermediate plate after coating of the blank in accordance with FIG. 4;

FIG. 6 shows a schematic cross section through a semiconductor chip stack having semiconductor chips in accordance with FIGS. 2 and 3 and the intermediate plate in accordance with FIG. 5;

FIG. 7 shows a schematic cross section through a semiconductor device position of a semiconductor device carrier;

FIG. 8 shows a schematic cross section through the semiconductor device carrier in accordance with FIG. 7 after application of a semiconductor chip stack in accordance with FIG. 6;

FIG. 9 shows a schematic cross section through the semiconductor device carrier in accordance with FIG. 8 after fitting of connecting elements;

DETAILED DESCRIPTION

Figure 1:
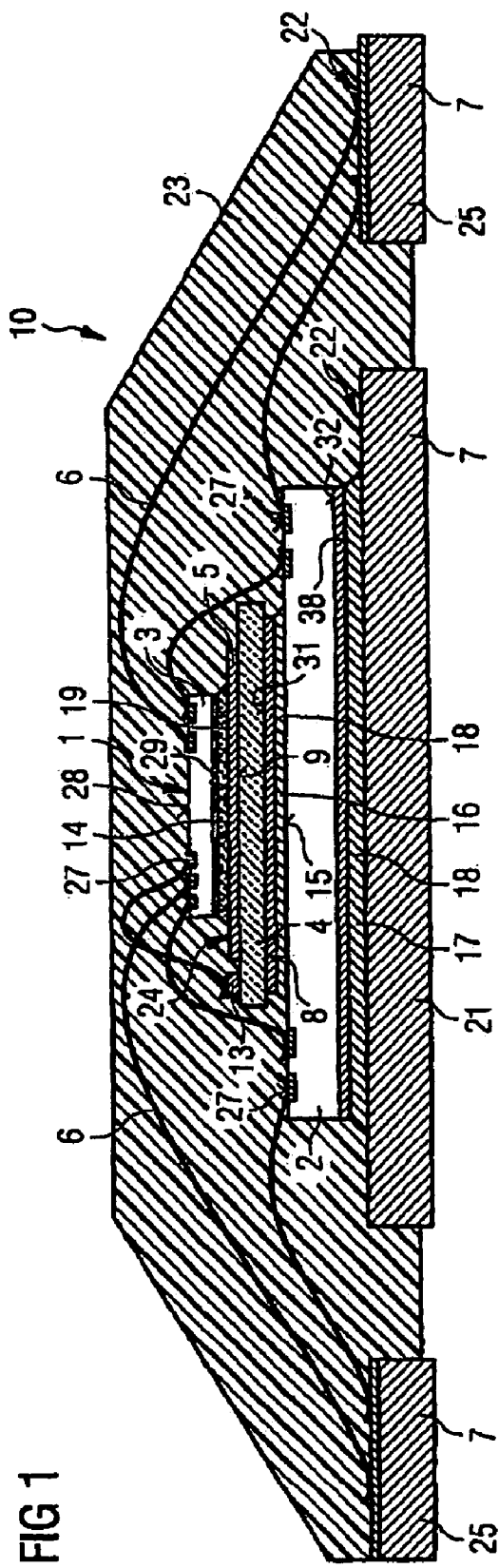
FIG. 1 shows a schematic cross section through a semiconductor device of one embodiment of the invention.

FIG. 1 shows a schematic cross section through a semiconductor device 10 of one embodiment of the invention. The semiconductor device 10 has a semiconductor chip stack 1 having at least one lower semiconductor chip 2 and an upper semiconductor chip 3 stacked thereon. An intermediate plate 4 is arranged between the semiconductor chips 2 and 3, the intermediate plate having an electrically conductive coating 5 on its top side 9.

The intermediate plate 4 can be a ceramic plate. Ceramic plates have the advantage that their thermal conductivity can be greater than the thermal conductivity of the stacked semiconductor chips 2 and 3, such that, by means of a ceramic intermediate plate 4, a heat loss that arises in the lower semiconductor chip 2 can be dissipated via the intermediate plate 4 and the upper semiconductor chip 3. It is also possible to make the intermediate plate 4 larger than is permitted by the areal extent of the lower semiconductor chip 2.

Moreover, it is possible for the intermediate plate 4 to be a plastic plate. Such a plastic plate as intermediate plate 4 can have a substance from the group polyimides, high-temperature thermoplastics, polybenzocyclobutene or polybenzoxazoles or mixtures thereof. Plastic plates of this type can be provided with a plating on one side, the plating constituting the conductive coating. The plating can also be patterned in order to provide both contact pads 13 for connecting elements 6 and contact pads 14 for the upper semiconductor chip 3, for example. The conductive coating 5 is patterned in such a way that it forms a wiring structure 24 on the top side 9 of the intermediate plate 4.

In this schematic cross section of the semiconductor device 10 the connecting elements 6 are bonding wires and connect for example the contact pads 13 on the top side 9 of the intermediate plate 4 to a contact area 27 on the top side 28 of the upper semiconductor chip 3, which is fixed by its rear side 29 on a contact pad 14 of the wiring structure 24 on the top side 9 of the intermediate plate 4.

The materials of the contact area 14 on the intermediate plate 4 for semiconductor chips 3 and the coating 34 on the rear side 29 of the upper semiconductor chip 3 can be coordinated with one another in such a way that a diffusion solder connection is possible. In the case of a diffusion solder connection of this type, in the course of diffusion soldering, intermetallic phases form which have a higher melting point than the melting point of the components of the diffusion solder. A solderable coating 16 on the top side 15 of the lower semiconductor chip 2 for fixing the intermediate plate 4 can also have a diffusion solder layer 18, which reacts with a plating 8 on the underside 31 of the intermediate plate. The diffusion solder layer 18 both for the solderable coating 16 and for the contact pad 14 has the advantage that the stack 1 composed of semiconductor chips 2 and 3 and an intermediate plate 4 arranged in between has a high thermostability and therefore withstands, without being damaged, subsequent process temperatures in the course of the production of a semiconductor device 10 of this type. Diffusion solder layers 18 are used in the areas in which firstly the semiconductor chip stack 1 is realized and is then intended to be fixed as semiconductor chip stack 1 for example on a semiconductor device carrier 22.

However, if a sequence of method steps that differs from this is provided, then it may be advantageous to provide a diffusion solder connection between a chip island 21 of the semiconductor device carrier 22 and the rear side 32 of the lower semiconductor chip 2 and then to apply the intermediate plate 4 and finally to apply the upper semiconductor chip 3 of the semiconductor chip stack 1. In this case it is advantageous to provide the first solder layer 17 as diffusion solder layer 18 and to realize the second fixing between intermediate plate 4 and lower semiconductor chip 2 by means of a soft solder layer, and finally to embody the topmost fixing layer between stacked semiconductor chip 3 and intermediate plate 4 by means of a conductive adhesive, such that in the manufacturing sequence a temperature grading results for the cohesive connections and it is ensured that the solder and adhesive connections do not mutually damage one another during the manufacturing sequence.

In one form of implementation for producing a semiconductor device, therefore, a patterned thin ceramic or polymer plate provided with a plurality of mutually electrically isolated metallic regions for chip fixing and for connecting element fixing is applied to the top side 15 of the lower semiconductor chip 2. In order to cohesively connect such an intermediate plate 4 by means of diffusion soldering or soft soldering, a solderable surface metallization composed, for example, of Ag, Au, Pd or PdAu is applied as the topmost layer to the top side of the lower semiconductor chip, while the underside of the ceramic or polymer plate has a metallic plating composed, for example, of Cu, Ag, Ni, or NiPdAu.

One or a plurality of upper semiconductor chips 3 can then be applied to the electrically insulating intermediate plate 4 based on ceramic or a polymer by means of conductive or insulating adhesive or a solder. In the case of a metallic solder connection, the top side of the ceramic or polymer intermediate plate then also likewise has a metallic coating composed of Cu, Ag, Ni, Pd or NiPdAu, for example. As a result, power semiconductor chips with vertical current flow, the chip rear side of which constitutes a drain terminal, for example, can also be electrically insulated from one another and applied one above another, thus resulting in a "chip stacking" or a "chip-on-chip" structure.

In addition, between the upper semiconductor chip 3 and the metallized regions of the wiring structure 24 on the insulation intermediate plate 4 and/or the lower semiconductor chip, electrical connections can be realized by means of metal wires, for example. Moreover, it is possible to provide a linking area for further upper semiconductor chips 3 on the lower semiconductor chip 2, the linking area being significantly larger than the lower semiconductor chip 2. The mounting area which is available for fitting stacked semiconductor chips 3 is thereby enlarged.

Various cohesive connections are possible between a chip island 21 of a semiconductor device carrier 22 and the rear side electrode 38 of the lower semiconductor chip 2 and also between the top side 15 of the lower semiconductor chip 2 and the intermediate plate 4 and also between the intermediate plate 4 and the upper semiconductor chip 3. The designer of the semiconductor device can choose between a solder layer, a diffusion solder layer, an insulating adhesive layer and an electronically conductive adhesive layer, in order to achieve an optimum cohesive connection between the individual components of the semiconductor chip stack 1 within the semiconductor device 10.

Furthermore, the surface-mountable external contacts are arranged on the underside of the semiconductor device 10 and embedded in a plastic housing composition apart from external contact areas as external terminals 7. For this purpose, the external contacts are constructed from leads 25 of a leadframe and have a chip island 21 for the lower semiconductor chip 2, wherein the chip island 21 and the leads 25 can merge into external terminals 7.

FIGS. 2 to 9 show schematic views of components of the semiconductor device 10 in accordance with FIG. 1 during the production thereof.

FIG. 2 shows a schematic cross section through an upper semiconductor chip 3 for a semiconductor chip stack. A semiconductor chip 3 of this type can be a power semiconductor device or an integrated circuit having control functions or a logic component and also a memory component. A semiconductor chip 3 of this type is produced from a semiconductor wafer, wherein a multiplicity of semiconductor chip positions are arranged in rows and columns on the semiconductor wafer.

A semiconductor chip 3 of this type is produced from a monocrystalline semiconductor material and has differently doped semiconductor zones which enable the actual switching, control, logic or memory function. The semiconductor zones are connected to contact areas 27 which are arranged on the top side 28 of the semiconductor chip 3 or are arranged as rear side electrode 33 on the rear side 29 of the upper semiconductor chip 3.

FIG. 3 shows a schematic cross section through a lower semiconductor chip 2 for a semiconductor chip stack. In this production method, with FIG. 3 a lower semiconductor chip 2 composed of silicon was provided, the top side 15 and the rear side 32 of which have a larger areal extent than that of the semiconductor chip 3 to be stacked, which is illustrated in FIG. 2. The thickness of the semiconductor chip 2 used as base semiconductor chip for the semiconductor chip stack is also greater than the thickness of the upper semiconductor chip 3 as shown by FIG. 2.

On the top side 15 of the lower semiconductor chip 2, contact areas 27 are arranged in the edge regions, the contact areas enabling a connection both to the upper semiconductor chip and to the external terminals of the semiconductor device with the inclusion of connecting elements. Power semiconductor devices can also be used as lower semiconductor chips 2 and as upper semiconductor chips. In order to connect the lower semiconductor chip 2 to the upper semiconductor chip, a metallization is provided on the top side 15 of the lower semiconductor chip 2, which metallization can have for example metals for a diffusion solder layer 18. Diffusion solder layers of this type have the advantage of a higher thermostability compared with soft solder layers or adhesive layers. The production of a semiconductor device according to the invention comprising a semiconductor chip stack requires not just the two semiconductor chips 2 and 3 but, as then shown by FIG. 4, a further intermediate plate 4.

FIG. 4 shows a schematic cross section through a blank 26 of an intermediate plate 4. A blank 26 of this type can be produced from ceramic, for example, for which purpose firstly a green body is formed, which subsequently contracts in a burning process to form a sintered ceramic. Moreover, it is customary to saw such ceramic plates as intermediate plates 4 from a sintered ceramic block in order to be able to produce precise top sides 9 and rear sides 31 of the blanks 26. In this case, the thickness of such a ceramic blank is approximately 0.5 mm.

Moreover, it is possible to produce such a blank 26 from a plastic, wherein as plastics a substance from the group polyimides, high-temperature thermoplastics, polybenzocyclobutene or polybenzoxazoles or mixtures thereof is used as material for the blank 26 of an intermediate plate 4. The blank 26 is subsequently provided with electrically conductive layers.

FIG. 5 shows a schematic cross section through an intermediate plate 4 after coating of the blank 26 from FIG. 4. A wiring structure 24 was applied on the top side 9 of the blank 26, which wiring structure emerged from a patterned plating. For this purpose, firstly an electroless chemical or electrolytic metal deposition is carried out. In an electrolytic metal deposition it is necessary for the surface of the ceramic plate to become conductive. For this purpose, an electrically conductive seed layer is applied for example by means of a sputtering method and the seed layer is subsequently contact-connected. In an electrolytic bath, a closed coating is then deposited, for example on the top side 9 of the intermediate plate 4.

The closed coating can subsequently be patterned by means of photolithography technology involving the formation of a photoresist mask. Various methods are used for patterning, preferably wet-chemical etching or dry etching by means of a plasma. The photoresist mask is subsequently removed, which can be done with the aid of a plasma ashing or with the aid of a solvent. This patterning gives rise to a wiring structure 24 on the top side 9 of the blank 26, which can subsequently be used either for fixing or cohesive connection to an upper semiconductor chip or for fitting of connecting elements. For this purpose, the wiring structure 24 shown has a contact pad 13 for connecting elements and a contact pad 14 for a semiconductor chip.

FIG. 6 shows a schematic cross section through a semiconductor chip stack 1 having semiconductor chips 2 and 3 in accordance with FIGS. 2 and 3 and the intermediate plate 4 in accordance with FIG. 5. The cohesive connections between the three components of the semiconductor chip stack 1 can be carried out in various ways; it is thus possible, by means of a solderable coating 16 composed of a diffusion solder material, to produce a diffusion solder layer 18 in interaction with the plating 8, such that the cohesive connection between the lower semiconductor chip 2 and the intermediate plate 4 has high temperature stability.

A chip island in the form of a contact pad 14 for the upper semiconductor chip 3 can likewise have a solderable coating, wherein the coating preferably comprises a soft solder, such that the fixing between intermediate plate 4 and lower semiconductor chip 2 is not jeopardized upon application of the stacked semiconductor device 3. Instead of a soft solder layer, this cohesive connection can also be effected by an insulating or by an electrically conductive adhesive layer 19.

In principle, it is possible firstly to produce a thermostable semiconductor chip stack 1 with an intermediate plate 4 or, in another exemplary implementation of the method, to provide a semiconductor chip carrier having a chip island on which, one after another, firstly the lower semiconductor chip 1, then the intermediate plate 4 and finally the upper semiconductor chip 3 are applied and thus stacked.

FIG. 7 shows a schematic cross section through a semiconductor device position 35 on a semiconductor device carrier 22, wherein the semiconductor device carrier 22 can have a multiplicity of such semiconductor device positions 35. A central chip island 21 as external terminal 7 is arranged in the semiconductor device position 35, the chip island being surrounded by leads 25 as external terminals 7.

FIG. 8 shows a schematic cross section through the semiconductor device carrier 22 in accordance with FIG. 7 after application of a semiconductor chip stack 1 in accordance with FIG. 6. In this case, the entire semiconductor chip stack 1, such as can be seen in FIG. 6, is either adhesively bonded by means of a conductive adhesive or soldered by means of soft solder onto the chip island 21 in order not to jeopardize the cohesive connections between the components of the semiconductor chip stack 1. On the other hand, it is possible for the components of the semiconductor chip stack 1 to be applied successively on the chip island 21. In this case, the solder layer 17 can also be a diffusion solder layer in order to create a thermostable cohesive connection which extends, without being damaged, the further process steps such as soldering and adhesive bonding of the components to form a semiconductor chip stack 1.

FIG. 9 shows a schematic cross section through the semiconductor device carrier 22 in accordance with FIG. 8 after fitting of connecting elements 6. The arrangement of the connecting elements 6 is purely schematic and not restricted to the cross section shown. The connecting elements 6 shown are merely intended to demonstrate what possibilities for the electrical connections between the external terminals 7 and the individual levels of the semiconductor chip stack 1 are possible.

Thus, contact areas 27 on the top side 28 of the upper semiconductor chip 3 can be connected to the upper wiring structure 24 on the intermediate plate 4 and, furthermore, contact pads 13 of the wiring structure 24 of the intermediate plate 4 can be connected via corresponding connecting elements 6 to contact areas 27 in edge regions of the lower semiconductor chip 2. It is also possible to connect the upper semiconductor chip 3 directly to external terminals 7 in the form of leads 25 and/or to electrically connect contact areas 27 of the lower semiconductor chip 2 to the corresponding leads 25 as external terminals 7. The contact areas 27 of the upper semiconductor chip 3 and of the lower semiconductor chip 2 can also be connected to one another via connecting elements 6.

After completion of the connections via connecting elements 6, the semiconductor device carrier 22 with the semiconductor chip stack 1 and the connecting elements 6 can be embedded into a plastic housing composition, from which project, whilst leaving them free, the external terminals 7 as surface-mountable external contacts on the underside of the semiconductor device 10, as shown by FIG. 1.

Figure 10:
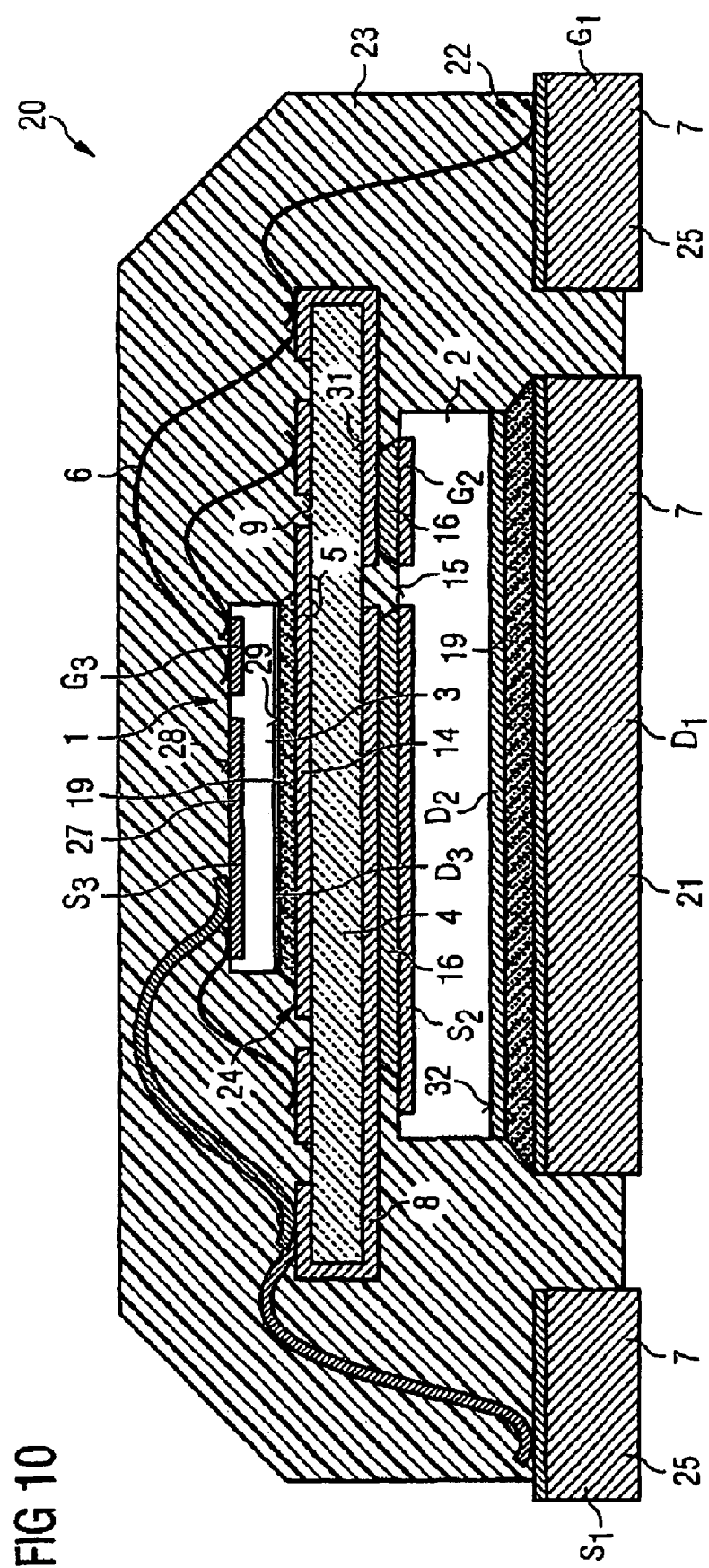
FIG. 10 shows a schematic cross section through a semiconductor device of a further embodiment of the invention.

FIG. 10 shows a schematic cross section through a semiconductor device 20 of a further embodiment of the invention. Components having the same functions as in the previous figures are identified by the same reference symbols and are not discussed separately.

In this embodiment of the invention in accordance with FIG. 10, adhesive connections are predominant as cohesive connection between the semiconductor device carrier and the semiconductor chip stack 1 and also within the semiconductor chip stack 1. For this purpose, the upper semiconductor chip 3 is applied by means of a connecting paste, which can be electrically conductive or insulating, onto a ceramic plate metallized with copper on both sides as intermediate plate 4, which can also be coated with nickel or with nickel alloys, wherein the intermediate plate 4 is in turn applied to the top side of the lower semiconductor chip 2 by means of a connecting paste.

The difference with respect to the embodiment shown in FIG. 1 is that here power semiconductor chips are stacked one on top of another. A further difference consists in the fact that the intermediate plate 4 has a larger areal extent than that of the lower semiconductor chip 2, such that also larger upper semiconductor chips 3 or semiconductor chips 3 of the same size can be stacked on the intermediate plate 4. Moreover, the copper plate coated on both sides is not only formed as wiring structure 24 on the top side 9, but is also patterned on the rear side 31, such that it can be connected to correspondingly adapted electrodes of the lower semiconductor device 2 such as a source electrode $S_2$ and a gate electrode $G_2$. The rear side 32 of the lower semiconductor chip 2 constitutes a drain electrode $D_2$, which can be externally contact-connected via the chip island 21 of the semiconductor device carrier 22 as drain electrode $D_1$. The stacked semiconductor chip 3 likewise has a drain electrode $D_3$ on its rear side 29 and a source electrode $S_3$ and a gate electrode $G_3$ on its top side 28. The gate electrode $G_2$ of the lower semiconductor chip 2 and the gate electrode $G_3$ of the upper semiconductor chip 3 are electrically connected to one another via the intermediate plate 4 and its wiring structures 24.

In this embodiment of the invention, the edge sides of the intermediate plate have conductor tracks, or through contacts are provided through the intermediate plate 4. In this embodiment, the two gate electrodes $G_2$ and $G_3$ are driven by a common gate terminal $G_1$ of the semiconductor device. However, it is also possible for the two semiconductor chips to be driven separately if corresponding connecting elements 6 are provided. The two source electrodes $S_3$ and $S_2$ are also routed together to an outer source electrode $S_1$ of the semiconductor device 20. Only the drain electrodes $D_2$ and $D_3$ can be accessed separately. For this purpose, the connecting lines between $D_3$ and an external terminal do not lie in the cross-sectional plane shown here.

Figure 11:
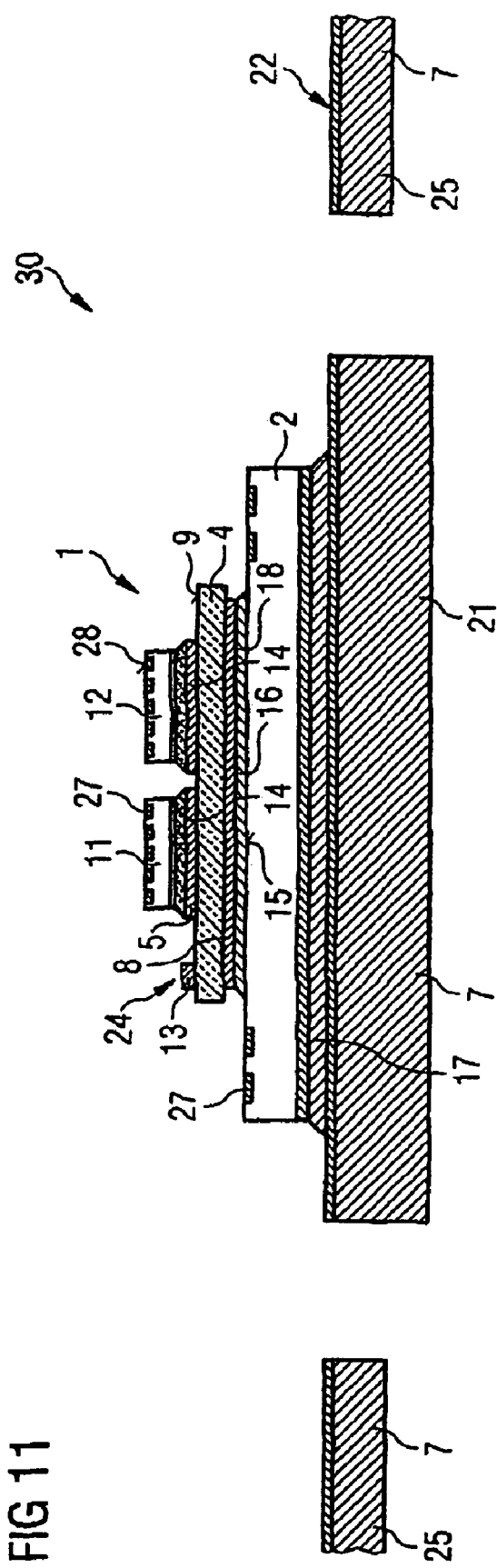
FIG. 11 shows a schematic cross section through a semiconductor chip stack of a semiconductor device of yet another embodiment of the invention.

FIG. 11 shows a schematic cross section through a semiconductor chip stack 1 of a semiconductor device 30 of a further embodiment of the invention. Components having the same functions as in the previous figures are identified by the same reference symbols and are not discussed separately.

In this further embodiment of the invention, the semiconductor device 30 has two upper semiconductor chips 11 and 12 on the intermediate plate 4, the semiconductor chips being fixed alongside one another and fulfilling various logic or memory functions.

For this purpose, the upper semiconductor chips 11 and 12 have a plurality of contact areas 27 on their top sides 28, which contact areas can be wired variously via connecting elements. An intermediate plate 4 is arranged onto the top side of the lower semiconductor chip 2 by means of a solder layer, which presupposes a solderable metallization of the top side, such as e.g. a coating composed of AgAu or PdAu as topmost coating on the lower semiconductor chip in order to fix the thin intermediate plate having a thickness of less than 0.5 mm. In this case, the thin intermediate plate can comprise an insulating material which is coated on both sides with copper or with nickel or with alloys thereof, as is indicated for "DCB" plates (direct copper bonding). The two upper semiconductor chips 11 and 12 illustrated here are fixed thereon by means of a solder layer.

Figure 12:
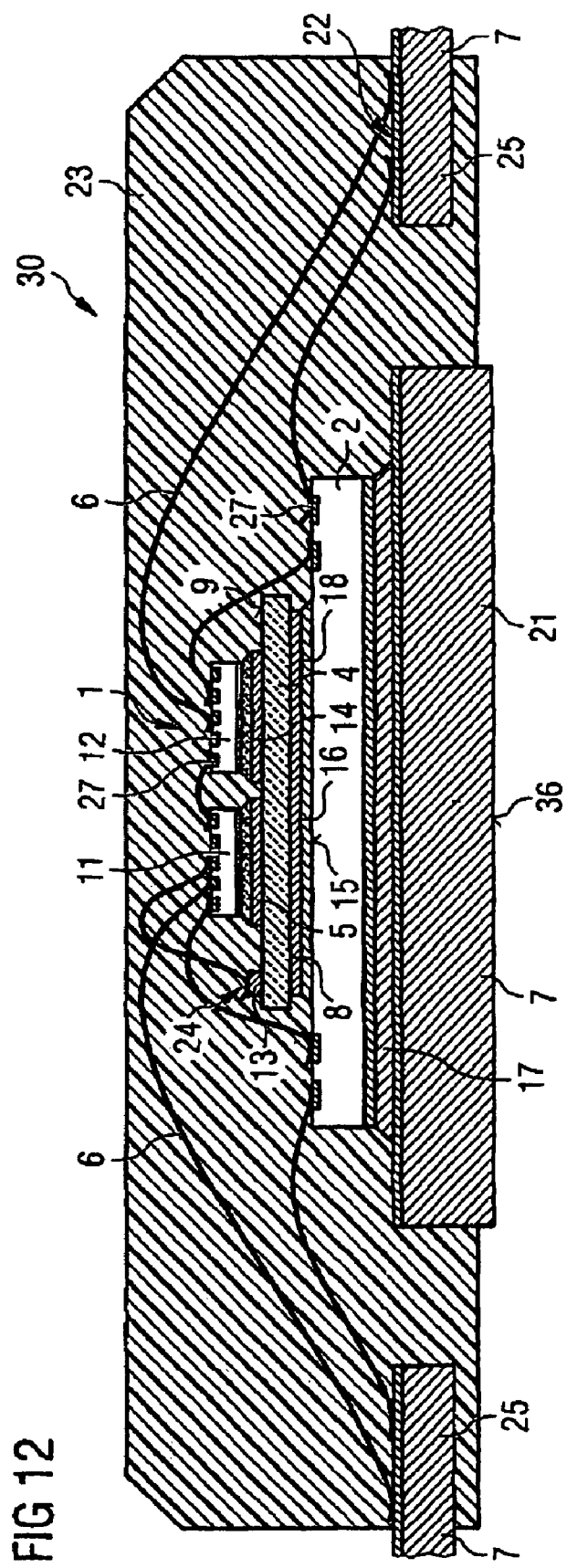
FIG. 12 shows a schematic cross section through the semiconductor chip stack in accordance with FIG. 11 after application of connecting elements.

FIG. 12 shows a schematic cross section through the semiconductor chip stack 1 in accordance with FIG. 11 after fitting of connecting elements 6. In this illustration, too, the connecting elements 6 depicted are merely intended to show what possibilities exist, in principle, for electrically connecting the individual levels of the semiconductor chip stack 1 among one another and/or to external terminals 7 or leads 25. In this case, the semiconductor chip island 21 as external terminal 7 has a larger metal thickness than the leads 25, provision being made for the leads 25 to project laterally from a plastic housing, while the underside 36 of the chip island 21 as cooling area and external terminal 7 projects from the plastic housing as surface-mountable external contact.

Figure 13:
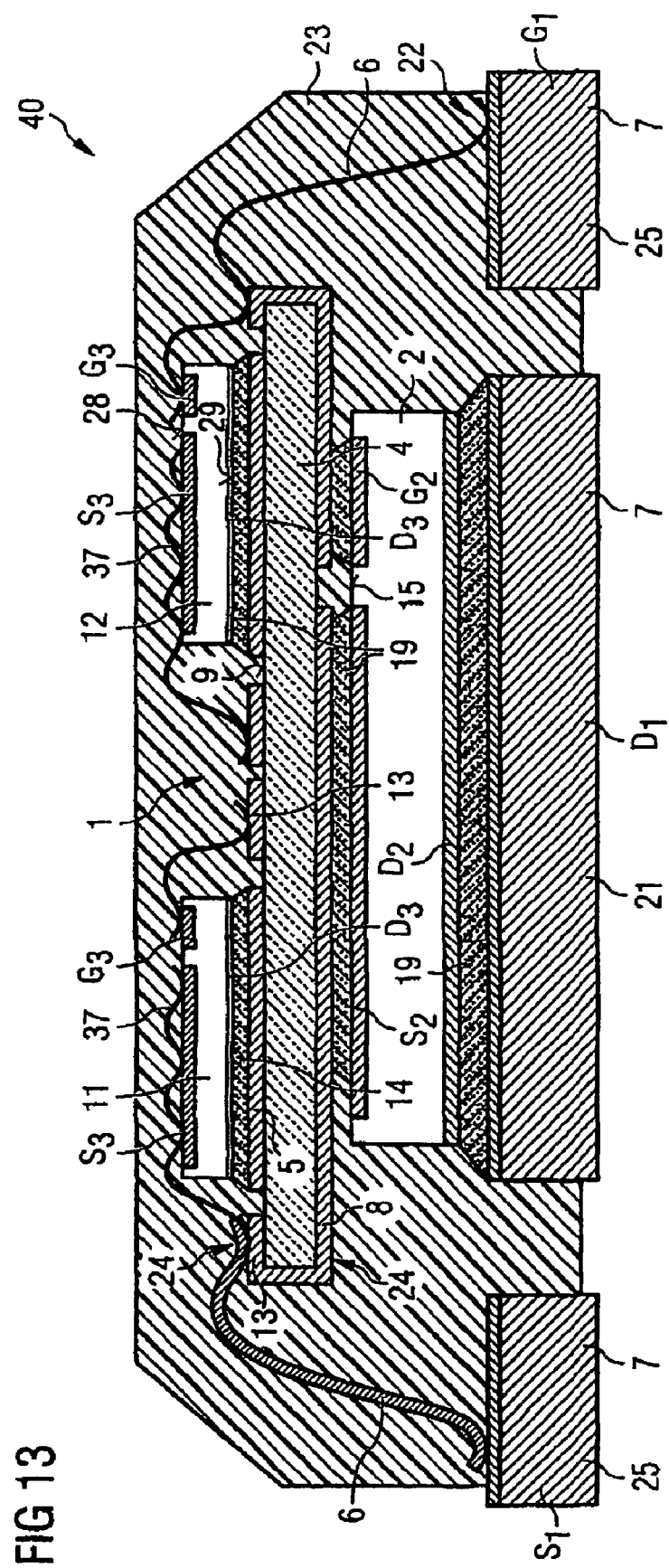
FIG. 13 shows a schematic cross section through a semiconductor device in accordance with a further embodiment of the invention.

FIG. 13 shows a schematic cross section through a semiconductor device 40 in accordance with a further embodiment of the invention. Components having the same functions as in the previous figures are identified by the same reference symbols and are not discussed separately.

In this case, in a manner similar to that in the case of the semiconductor device 20 in accordance with FIG. 10, power semiconductor chips are stacked one above another, wherein the intermediate plate 4 has a larger areal extent than that of the lower semiconductor chip 2. Here as well the intermediate plate 4 is provided with wiring structures 24 on both sides. Two power semiconductor chips 11 and 12 are arranged on the top side 9 of the intermediate plate 4, the power semiconductor chips in each case having a source electrode $S_3$ and a gate electrode $G_3$ on their top sides 28.

The rear sides 29 of the upper semiconductor chips 11 and 12 are fixed on corresponding contact pads 14 of the wiring structure 24 of the intermediate plate 4 as drain electrodes $D_3$. Once again two electrodes, namely a source electrode $S_2$ and a gate electrode $G_2$, are arranged on the top side 15 of the lower semiconductor chip 2, which electrodes are electrically connected to the electrodes of the upper semiconductor chips 11 and 12 via corresponding conductor tracks of the lower wiring structure 24 of the intermediate plate 4. The high-current-carrying connecting elements 37 for the upper semiconductor chips 11 and 12 are embodied as bonding tapes which are bonded multiply on the source electrodes $S_3$.

What is claimed is:

1. A semiconductor device comprising:
    a semiconductor chip stack including at least one lower semiconductor chip as base of the semiconductor chip stack, and at least one upper semiconductor chip;
    an insulating intermediate plate arranged between the semiconductor chips, the insulating intermediate plate having a patterned structure on a top side and rear side thereof, and edge side faces thereof having conductor tracks that electrically connect the top and rear side patterned structures, wherein the intermediate plate is mounted directly on the lower semiconductor chip with an electrically conductive layer, and wherein the edge side faces of the intermediate plate project beyond edge side faces of the lower semiconductor chip; and
    connecting elements which electrically connect the semiconductor chips, the intermediate plate and external terminals to one another;
    wherein the semiconductor device has surface-mountable external contacts on its underside, and
    wherein the at least one lower semiconductor chip and the at least one upper semiconductor chip are electrically connected to one another via the conductor tracks of the edge side faces and the top and rear side patterned structures.

2. The semiconductor device as claimed in claim 1, wherein the intermediate plate (4) is a ceramic plate.

3. The semiconductor device as claimed in claim 1, wherein the patterned structure comprises a substance from a group consisting of copper, silver, nickel, palladium, nickel/palladium/gold or alloys thereof.

4. The semiconductor device as claimed in claim 1, wherein the intermediate plate has a higher thermal conductivity than silicon crystal of the semiconductor chips.

5. The semiconductor device as claimed in claim 1, wherein the intermediate plate has an areal extent greater than that of the at least one lower semiconductor chip.

6. The semiconductor device as claimed in claim 1, wherein a plurality of semiconductor chips are arranged alongside one another on the intermediate plate.

7. The semiconductor device as claimed in claim 1, wherein the patterned structure has contact pads for connecting elements and contact pads for the at least one upper semiconductor chip.

8. The semiconductor device as claimed in claim 1, wherein the at least one lower semiconductor chip has a coating composed of gold, silver, palladium or palladium/gold or alloys thereof on a top side thereof.

9. The semiconductor device as claimed in claim 1, wherein the intermediate plate and the semiconductor chips are fixed on one another by means of cohesive connections.

10. The semiconductor device as claimed in claim 9, wherein at least one of the cohesive connections comprises a solder layer.

11. The semiconductor device as claimed in claim 9, wherein at least one of the cohesive connections comprises a diffusion solder layer.

12. The semiconductor device as claimed in claim 9, wherein at least one of the cohesive connections comprises an insulating adhesive layer.

13. The semiconductor device as claimed in claim 9, wherein at least one of the cohesive connections comprises an electrically conductive adhesive layer.

14. The semiconductor device as claimed in claim 9, wherein a cohesive connection between the intermediate plate and one of the semiconductor chips and a cohesive connection between the intermediate plate and another one of the semiconductor chips have different properties.

15. The semiconductor device as claimed in claim 1, wherein the intermediate plate is a plastic plate.

16. The semiconductor device as claimed in claim 15, wherein the plastic plate comprises a substance from a group consisting of polyimides, high-temperature thermoplastics, polybenzocyclobutene or polybenzoxazoles or mixtures thereof.

17. The semiconductor device as claimed in claim 1, wherein the at least one lower semiconductor chip has a solderable coating on a top side thereof.

18. The semiconductor device as claimed in claim 17, wherein the solderable coating comprises a metal layer.

19. The semiconductor device as claimed in claim 1, wherein the surface-mountable external contacts on the underside of the semiconductor device are embedded in a plastic housing composition apart from external contact areas.

20. The semiconductor device as claimed in claim 19, wherein the surface-mountable external contacts have leads of a leadframe with a chip island for the at least one lower semiconductor chip.

* * * * *